United States Patent
Watanabe et al.

(10) Patent No.: US 10,460,970 B2
(45) Date of Patent: Oct. 29, 2019

(54) ELECTROSTATIC CHUCK

(71) Applicant: NGK INSULATORS, LTD., Nagoya (JP)

(72) Inventors: Morimichi Watanabe, Nagoya (JP); Tsutomu Nanataki, Toyoake (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 15/903,175

(22) Filed: Feb. 23, 2018

(65) Prior Publication Data

US 2018/0190527 A1 Jul. 5, 2018

Related U.S. Application Data

(63) Continuation of application No. PCT/JP2016/078267, filed on Sep. 26, 2016.

(30) Foreign Application Priority Data

Sep. 30, 2015 (JP) .................................. 2015-193943
Sep. 30, 2015 (JP) .................................. 2015-193944
May 19, 2016 (JP) .................................. 2016-100720

(51) Int. Cl.
*H01L 21/683* (2006.01)
*C04B 35/111* (2006.01)
(Continued)

(52) U.S. Cl.
CPC .......... *H01L 21/6833* (2013.01); *B32B 18/00* (2013.01); *C04B 35/101* (2013.01);
(Continued)

(58) Field of Classification Search
CPC ... H01L 21/6833; H01L 21/683; B32B 18/00; C04B 35/101; C04B 35/111;
(Continued)

(56) References Cited

U.S. PATENT DOCUMENTS 5,737,178 A 4/1998 Herchen
5,754,391 A 5/1998 Bates
(Continued)

FOREIGN PATENT DOCUMENTS

JP S51-030209 A1 3/1976
JP H09-172054 A1 6/1997
(Continued)

OTHER PUBLICATIONS

Furushima et al. "Orientation distribution-Lotgering factor relationship in a polycrystalline material", Jul. 12, 2010, Journal of the Ceramic Society of Japan 118 (10) 921-926. (Year: 2010).*
(Continued)

*Primary Examiner* — Zeev V Kitov
(74) *Attorney, Agent, or Firm* — Burr & Brown, PLLC (57) ABSTRACT

An electrostatic chuck includes a dielectric layer including an oriented alumina sintered body having a degree of c-plane orientation of 5% or more, the degree of c-plane orientation being determined by a Lotgering method using an X-ray diffraction profile obtained by the irradiation of an X-ray in the 2θ range of 20° to 70°; a ceramic layer integrated with a surface disposed opposite a wafer placement surface of the dielectric layer; and an electrostatic electrode between the dielectric layer and the ceramic layer.

16 Claims, 4 Drawing Sheets

(51) Int. Cl.
　　　*C04B 35/101*　　(2006.01)
　　　*C04B 35/634*　　(2006.01)
　　　*C04B 35/64*　　(2006.01)
　　　*B32B 18/00*　　(2006.01)
　　　*C04B 35/626*　　(2006.01)
　　　*C04B 35/638*　　(2006.01)
　　　*C04B 35/645*　　(2006.01)
　　　*C04B 37/00*　　(2006.01)
　　　*H01L 21/687*　　(2006.01)

(52) U.S. Cl.
　　　CPC ......... *C04B 35/111* (2013.01); *C04B 35/1115* (2013.01); *C04B 35/6262* (2013.01); *C04B 35/6264* (2013.01); *C04B 35/638* (2013.01); *C04B 35/6342* (2013.01); *C04B 35/64* (2013.01); *C04B 35/645* (2013.01); *C04B 37/005* (2013.01); *H01L 21/6831* (2013.01); *H01L 21/68757* (2013.01); *C04B 2235/322* (2013.01); *C04B 2235/3206* (2013.01); *C04B 2235/3217* (2013.01); *C04B 2235/3262* (2013.01); *C04B 2235/445* (2013.01); *C04B 2235/5292* (2013.01); *C04B 2235/5296* (2013.01); *C04B 2235/5436* (2013.01); *C04B 2235/5445* (2013.01); *C04B 2235/6025* (2013.01); *C04B 2235/6567* (2013.01); *C04B 2235/6586* (2013.01); *C04B 2235/72* (2013.01); *C04B 2235/77* (2013.01); *C04B 2235/786* (2013.01); *C04B 2235/787* (2013.01); *C04B 2235/96* (2013.01); *C04B 2235/963* (2013.01); *C04B 2237/064* (2013.01); *C04B 2237/343* (2013.01); *C04B 2237/52* (2013.01)

(58) Field of Classification Search
　　　CPC ............. C04B 35/1115; C04B 35/6262; C04B 35/6264; C04B 35/6342; C04B 35/638; C04B 35/64; C04B 35/645; C04B 37/005; H02N 13/00

USPC ........................................................ 361/234
See application file for complete search history.

(56) References Cited

U.S. PATENT DOCUMENTS

| | | | |
|---|---|---|---|
| 6,986,865 B2 * | 1/2006 | Lin | C04B 35/117 264/618 |
| 2003/0123213 A1 | 7/2003 | Kosakai | |
| 2005/0152089 A1 | 7/2005 | Matsuda et al. | |
| 2010/0227145 A1 * | 9/2010 | Teratani | C04B 35/117 428/220 |
| 2014/0065360 A1 * | 3/2014 | D'Evelyn | C30B 29/406 428/141 |
| 2014/0338834 A1 * | 11/2014 | Tanaka | C04B 35/443 156/345.1 |
| 2016/0049323 A1 * | 2/2016 | Ye | H01L 21/6833 361/234 |
| 2017/0182567 A1 * | 6/2017 | Okude | B23B 27/14 |

FOREIGN PATENT DOCUMENTS

| | | |
|---|---|---|
| JP | H11-026565 A1 | 1/1999 |
| JP | H11-310451 A1 | 11/1999 |
| JP | 2000-509552 A1 | 7/2000 |
| JP | 3348140 B2 | 11/2002 |
| JP | 2005-210077 A1 | 8/2005 |
| JP | 4008230 B2 | 11/2007 |

OTHER PUBLICATIONS

International Search Report and Written Opinion (Application No. PCT/JP2016/078267) dated Nov. 1, 2016.
English translation of the International Preliminary Report on Patentability (Chapter I) (Application No. PCT/JP2016/078267) dated Apr. 12, 2018, 9 Pages.

\* cited by examiner

ELECTROSTATIC CHUCK

BACKGROUND OF THE INVENTION

1. Field of the Invention

The present invention relates to an electrostatic chuck.

2. Description of the Related Art

An electrostatic chuck fixes a wafer on a dielectric layer using an electrostatic force generated between the wafer and an electrostatic electrode. As the electrostatic force, the Coulomb force and the Johnsen-Rahbek force are known. Electrostatic chucks are used in semiconductor production processes such as plasma etching and CVD and can be exposed to highly corrosive halogen plasmas. Thus, electrostatic chucks are required to have high plasma corrosion resistance. Alumina and AlN are widely used as materials of electrostatic chucks (for example, see PTLs 1 and 2).

CITATION LIST

Patent Literature

PTL 1: Japanese Patent No. 3348140
PTL 2: Japanese Patent No. 4008230

SUMMARY OF THE INVENTION

In the semiconductor production processes described above, the etching rates and the film-formation rates express distributions on a surface of the wafer, in some cases. Usually, heat is input to a wafer by a plasma, and the temperature of the wafer is controlled using heat conduction to an electrostatic chuck. However, when the adhesion between the wafer and the electrostatic chuck is not uniform on a surface of the wafer, the extent of heat conduction is not uniform. This results in a temperature distribution on the surface of the wafer to cause variations in etching rate or the like. Thus, the adhesion between the wafer and the electrostatic chuck is desirably uniform on the surface of the wafer.

In plasma etching and chamber cleaning processes, a halogen-based plasma is used, in some cases. Thus, members, such as electrostatic chucks, of semiconductor production apparatuses are required to have high plasma corrosion resistance. As described above, alumina has good corrosion resistance and is widely used for these members. However, a difficulty lies in completely inhibiting corrosion due to a plasma. The corrosion can cause the formation of solid reaction products and particle shedding (hereinafter, referred to as "particles"). When the particles adhere to a surface of a wafer, the performance of the resulting semiconductor device is significantly degraded; thus, the amount of particles needs to be reduced. The particles are significantly formed when surface corrosion due to a halogen plasma occurs non-uniformly. For example, when a wafer is placed on an electrostatic chuck having marked irregularities due to non-uniform corrosion, the contact between the wafer and a surface of the electrostatic chuck is liable to cause the formation of particles. Thus, the material of the electrostatic chuck is required to have the following properties: preferably, the material is uniformly corroded when exposed to a halogen plasma. The uniform corrosion maintains the form of a surface and the uniformity of an attractive force, thereby extending the life of the electrostatic chuck.

The present invention has been accomplished in order to solve the foregoing problems. It is a main object of the present invention to maximize the uniformity of a wafer attraction force and plasma corrosion resistance on a wafer placement surface.

An electrostatic chuck according to the present invention includes a dielectric layer including an oriented alumina sintered body having a degree of c-plane orientation of 5% or more, the degree of c-plane orientation being determined by a Lotgering method using an X-ray diffraction profile obtained by the irradiation of an X-ray in the 2θ range of 20° to 70°, a ceramic layer integrated with a surface disposed opposite a wafer placement surface of the dielectric layer, and an electrostatic electrode between the dielectric layer and the ceramic layer.

The electrostatic chuck of the present invention is more uniform in a wafer attraction force and plasma corrosion resistance on the wafer placement surface than ever before. Furthermore, the wafer attraction force is higher than ever before. The reasons the effects are provided are not clear, but they seems to be as follows: In view of the attractive force, the c-plane orientation of the alumina sintered body included in the dielectric layer results in uniform electrical properties, which is advantageous. In view of plasma corrosion resistance, the c-plane orientation of sintered grains exposed on a surface results in a uniform corrosion rate. Furthermore, there is no difference in corrosion rate between grain boundaries and the inside of grains, so that the corroded surface is maintained at a flat surface.

DETAILED DESCRIPTION OF THE INVENTION

An electrostatic chuck according to the present embodiment includes a dielectric layer including an oriented alumina sintered body having a degree of c-plane orientation of 5% or more, the degree of c-plane orientation being determined by a Lotgering method using an X-ray diffraction profile obtained by the irradiation of an X-ray in the 2θ range of 20° to 70°, a ceramic layer integrated with a surface disposed opposite a wafer placement surface of the dielectric layer, and an electrostatic electrode between the dielectric layer and the ceramic layer.

The ceramic layer preferably contains alumina as a main component. In this case, the thermal expansion coefficient of the ceramic layer can be close to that of the dielectric layer, thus preventing thermal stress generation at the bonding portion thereof. To further reduce the thermal stress due to the difference in thermal expansion coefficient therebetween, the ceramic layer is preferably formed of the oriented alumina sintered body. In this case, the difference in thermal expansion between the dielectric layer and the ceramic layer can be nearly eliminated.

The oriented alumina sintered body included in the dielectric layer preferably has a higher degree of c-plane orientation and preferably has a degree of c-plane orientation of 5% or more, preferably 30% or more, more preferably 60% or more, more preferably 70% or more, more preferably 90% or more, most preferably 100%. As the degree of c-plane orientation is increased, the uniformity of a wafer attraction force tends to be improved on the wafer placement surface, and the wafer attraction force tends to be increased. Furthermore, when the dielectric layer is exposed to a halogen plasma, the wafer placement surface of the dielectric layer tends to be uniformly corroded.

The grain size of the oriented alumina sintered body included in the dielectric layer is preferably, but not necessarily, 15 to 200 μm. In this case, the uniformity of the attractive force and the uniformity of corrosion are improved. The grain size refers to an average sintered grain size and is preferably 15 to 200 μm, more preferably 20 to 200 μm. In view of the strength of the oriented alumina sintered body, a smaller sintered grain size is preferred, and the sintered grain size is preferably 150 μm or less, more preferably 100 μm or less. Accordingly, from the three points of view of the uniformity of the attractive force, the uniformity of corrosion, and the strength, the sintered grain size is preferably 15 to 100 μm, more preferably 20 to 100 μm. The grain size is determined as follows: A predetermined cross section of the alumina sintered body (for example, a cross section parallel to the c-plane) is mirror-polished. The polished surface is subjected to thermal etching treatment. An image of the resulting surface is captured. A rectangular field of view is defined on the resulting image. Two diagonals are drawn on the rectangular field of view. The average length of segments in all grains intersecting with the diagonals is determined. The average length is multiplied by 1.5.

Preferably, the oriented alumina sintered body included in the dielectric layer has a volume resistivity of $1 \times 10^{17}$ Ωcm or more at room temperature and a volume resistivity of $1 \times 10^{15}$ Ωcm or more at 200° C. The oriented alumina sintered body preferably has a volume resistivity of $1 \times 10^{14}$ Ωcm or more in the range of 300° C. to 400° C. In this case, the attractive force can be maintained at a high level, a leakage current can be reduced, and a good detachment response can be provided in a wider temperature range.

In the oriented alumina sintered body included in the dielectric layer, a lower angle of tilt (tilt angle) of the crystal axis of each of the sintered alumina grains with respect to the c-axis, which is an orientation axis, results in an improvement in the uniformity of the wafer attraction force on the wafer placement surface. The tilt angle can be evaluated by the full width at half maximum of an X-ray rocking curve (XRC·FWHM) obtained by subjecting a surface of the oriented alumina sintered body to an X-ray rocking curve method (omega scan). In view of uniformity, a lower tilt angle is preferred. The XRC·FWHM is preferably 15° or less, more preferably 10° or less, further preferably 7.5° or less, particularly preferably 5° or less, more particularly preferably 4° or less, even more particularly preferably 1° or less.

Impurities other than Mg, C, or F in the oriented alumina sintered body included in the dielectric layer are preferably minimized. In this case, the uniformity of corrosion can be improved. The contamination of a wafer with impurities can be inhibited. The content of each of the impurities other than Mg, C, or F is preferably 50 ppm or less, more preferably 10 ppm or less. The content of C is preferably 100 ppm or less, more preferably 70 ppm or less, even more preferably 50 ppm or less. These contents can be measured by, for example, firing (high-frequency heating)-infrared absorption spectroscopy for C and S, an inert gas fusion-thermal conductivity method for N, inert gas fusion-nondispersive infrared absorption spectroscopy for H, and ICP emission spectrometry and ICP-mass spectrometry for other elements (mainly, Si, Fe, Ti, Na, Ca, K, P, V, Cr, Mn, Co, Ni, Cu, Zn, Y, Zr, Pb, Bi, Li, Be, B, Cl, Sc, Ga, Ge, As, Se, Br, Rb, Sr, Nb, Mo, Ru, Rh, Pd, Ag, Cd, In, Sn, Sb, Te, Cs, Ba, Hf, Ta, W, Ir, Pt, Au, Hg, La, Ce, Pr, Nd, Sm, Eu, Gd, Tb, Dy, Ho, Er, Tm, Yb, and Lu). In view of the flexural strength of the oriented alumina sintered body, the content of F is preferably minimized and is preferably 200 ppm or less by mass.

The oriented alumina sintered body included in the dielectric layer desirably has high density and preferably has a bulk density of 3.90 to 4.00 g/cm$^3$.

Preferably, the oriented alumina sintered body included in the dielectric layer is free of pores. The proportion by volume of pores having a size of 0.2 μm or more is preferably 130 ppm or less. In this case, the amount of particles generated can be reduced. A pore portion has a significantly higher corrosion rate than a surrounding portion. The corrosion rate tends to be non-uniform. Thus, a reduction in the volume of the pores allows a corroded surface to be maintained at a flat form when the oriented alumina sintered body is exposed to a halogen plasma. The proportion of the pore volume is calculated as follows: A freely-selected cross section of the alumina sintered body is polished by ion milling. The polished cross section is observed with a scanning electron microscope at a magnification of 1,000, and the number of pores is counted. For example, 12 images of fields of view each having a length of 92.5 μm and a width of 124.0 μm of the polished cross section are captured with the scanning electron microscope at a magnification of 1,000 in such a manner that four images in the longitudinal direction and three images in the width direction are arranged to form a continuous image (370.0 μm in length×372.0 μm in width). The number of pores on the 12 images is visually counted. The polishing by the ion milling is employed because particles are not generated from the section. An example of a polishing apparatus using ion milling is a cross-section polisher (available from JEOL, Ltd). Pores appear as black spots on the images taken at a magnification of 1,000 and thus can be sufficiently visually identified. The proportion by volume of pores having a diameter of 0.2 μm or more with respect to the volume of the alumina sintered body is calculated using the following formula. Proportion by volume of pores=$\{\pi \times (R/2)^2 / 137640\} \times N$, where R: the diameter of the pores (μm)

N: the number of the pores

The number of foreign objects in the oriented alumina sintered body included in the dielectric layer is preferably minimized. Preferably, when an image obtained by capturing a field of view having a length of 370.0 μm and a width of 372.0 μm with a scanning electron microscope at a magnification of 1,000 is visually observed, the number of foreign objects having a diameter of 0.2 μm or more is 50 or less. The foreign objects refer to objects composed of a different substance from alumina. For example, when a backscattered electron image of a polished cross section is captured with a scanning electron microscope, the foreign objects have a different contrast from the surrounding alumina and thus can be easily distinguished. In this case, the uniformity of corrosion can be increased. A method for counting foreign objects is as follows: A freely-selected cross section of the alumina sintered body according to the embodiment is polished by ion milling. A backscattered electron image of the polished cross section is observed with a scanning electron microscope at a magnification of 1,000, and the number of foreign objects is counted. For example, 12 images of fields of view each having a length of 92.5 µm and a width of 124.0 µm of the polished cross section are captured with the scanning electron microscope at a magnification of 1,000 in such a manner that four images in the longitudinal direction and three images in the width direction are arranged to form a continuous image (370.0 µm in length×372.0 µm in width). The number of foreign objects on the 12 images is visually counted. The foreign objects can be distinguished with higher accuracy in combination with energy dispersive X-ray spectroscopy (EDS) or an electron probe microanalyzer (EPMA).

The oriented alumina sintered body included in the dielectric layer preferably has a flexural strength of (JIS R1601) of 200 MPa or more. In this case, the oriented alumina sintered body is less likely to incur damage such as cracking during processing such as drilling. Furthermore, an electrostatic chuck including the oriented alumina sintered body is less likely to chip in use, thus preventing the generation of particles and improving durability. More preferably, the flexural strength is 300 MPa or more.

Figure 1:
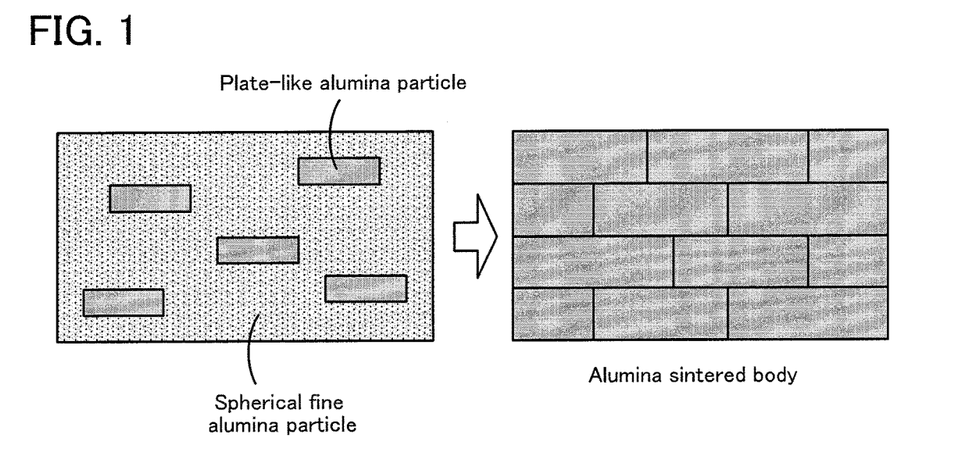
FIG. 1 is a schematic diagram illustrating a step of forming an alumina sintered body by a TGG method.

A method for producing an oriented alumina sintered body is not particularly limited. For example, the oriented alumina sintered body can be produced by forming and sintering a plate-like alumina powder alone or a powder mixture of a plate-like alumina powder and a fine alumina powder having a smaller average particle size than the plate-like alumina powder. When the powder mixture of the plate-like alumina powder and the fine alumina powder is formed, the plate-like particles are easily oriented during formation (for example, tape casting, extrusion molding, casting, injection molding, or uniaxial pressing). During sintering, the plate-like alumina powder is formed into seed crystals (template), the fine alumina powder is formed into a matrix, and the template is homoepitaxially grown while taking in the matrix. This production method is what is called a templated grain growth (TGG) method. FIG. 1 is a schematic diagram illustrating a step of forming an alumina sintered body by the TGG method. In the TGG method, the microstructure of the resulting alumina sintered body can be controlled by the particle size and the mixing ratio of the plate-like alumina powder and the fine alumina powder. The resulting alumina sintered body easily has a high density and an improved degree of orientation, compared with the case where the plate-like alumina powder is sintered. The content of the plate-like alumina powder in the powder mixture is preferably 0.1% to 15% by mass, more preferably 0.5% to 10% by mass.

The oriented alumina sintered body is preferably sintered by pressure sintering (for example, hot-pressing sintering or HIP sintering). Pressureless pre-sintering may be performed before the pressure sintering. When the HIP sintering is performed, a capsule method may be employed. The sintering temperature is preferably 1,500° C. to 2,050° C. In the case of the hot-pressing sintering, the pressure is preferably 50 kgf/cm$^2$ or more, more preferably 200 kgf/cm$^2$ or more. In the case of the HIP sintering, the pressure is preferably 1,000 kgf/cm$^2$ or more, more preferably 2,000 kgf/cm$^2$ or more.

The electrostatic chuck according to the embodiment includes the electrostatic electrode between the dielectric layer and the ceramic layer. Preferably, the dielectric layer, the electrostatic electrode, and the ceramic layer are integrally sintered by a hot-pressing method. In this case, the dielectric layer, the electrostatic electrode, and the ceramic layer can be tightly bonded together without interposing an adhesive layer, so that the electrostatic chuck has improved corrosion resistance. A method for producing an electrostatic chuck is not particularly limited. The electrostatic chuck may be produced as follows: After the ceramic layer is formed in advance, the electrostatic electrode is formed on the ceramic layer, and then the dielectric layer is formed so as to cover the electrostatic electrode; a ceramic layer formation green body or its degreased body to be formed into the ceramic layer is formed, the electrostatic electrode is formed thereon, a dielectric layer formation green body or its degreased body is stacked so as to cover the electrostatic electrode, and sintering is performed so as to integrate them; or after the formation of an oriented alumina compact in which the electrostatic electrode is embedded, sintering is performed. In this case, both of the ceramic layer and the dielectric layer are formed of the oriented alumina sintered body. The electrostatic electrode can be composed of a high-melting-point metal such as molybdenum (Mo), tungsten (W), or WC. The form of the electrostatic electrode is not particularly limited.

The electrostatic chuck according to the embodiment may include a heater element to heat a wafer. The heater element is a resistance heating element. The heater element can be composed of a high-melting point metal such as molybdenum (Mo), tungsten (W), or WC. The form of the heater element is not particularly limited. For example, as the heater element, a linear-, coil-, or strip-like bulk metal, a printed element, or a thin metal film may be used, the printed element being formed by subjecting a printing paste containing a metal powder, to application by printing, drying, and sintering.

In the electrostatic chuck according to the embodiment, although the electrostatic force acting between a wafer and the dielectric layer may be the Coulomb force and the Johnsen-Rahbek force, the Coulomb force is preferred. The Coulomb force provides a higher wafer attraction force and better uniformity of the wafer attraction force on the wafer placement surface. When the electrostatic force is the Coulomb force, the dielectric layer preferably has a thickness of 0.05 mm to 0.50 mm. In this case, the Coulomb force can be increased to provide a high attractive force.

Figure 2:
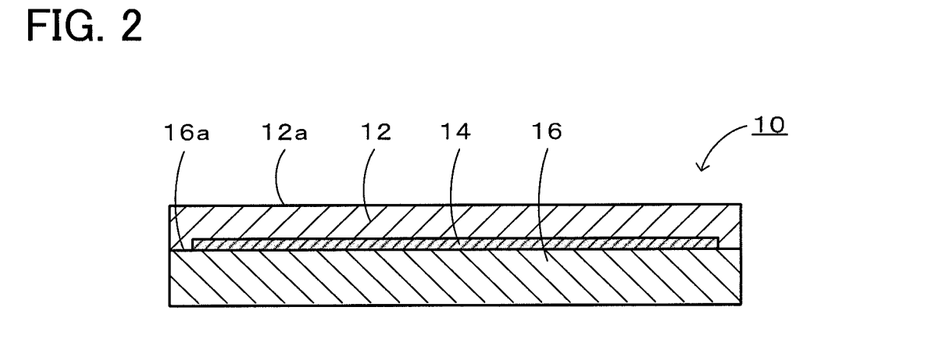
FIG. 2 is a longitudinal sectional view of an electrostatic chuck 10.
Figure 3:
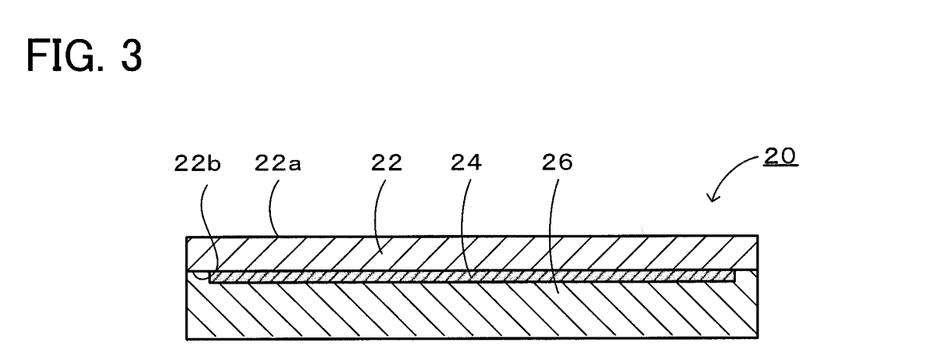
FIG. 3 is a longitudinal sectional view of an electrostatic chuck 20.
Figure 4:
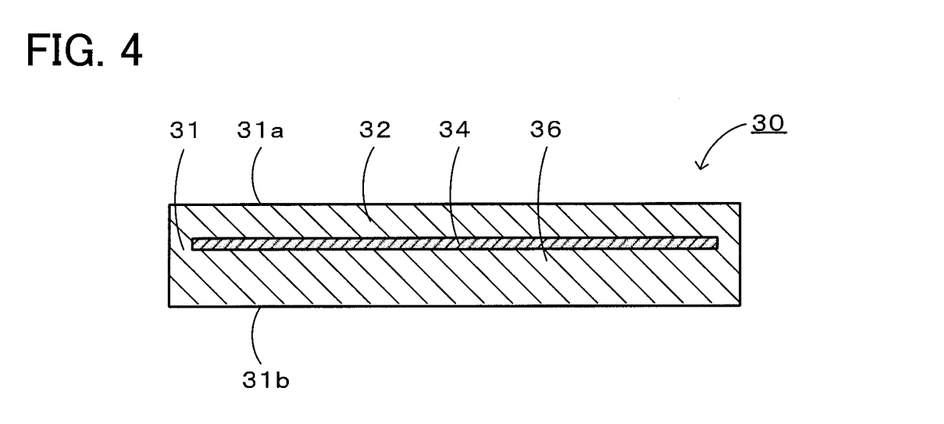
FIG. 4 is a longitudinal sectional view of an electrostatic chuck 30.

A typical example of the electrostatic chuck according to the embodiment will be described below with reference to the drawings. FIGS. 2 to 4 are longitudinal sectional views of electrostatic chucks 10, 20, and 30 each having a circular shape in its entirety. In the electrostatic chuck 10 illustrated in FIG. 2, an electrostatic electrode 14 is arranged on a surface 16a of a ceramic layer 16, and a dielectric layer 12 is arranged on the surface 16a of the ceramic layer 16 so as to cover the electrostatic electrode 14. A surface of the dielectric layer 12 opposite the ceramic layer 16 is a wafer placement surface 12a. The dielectric layer 12 and the ceramic layer 16 may be bonded together with an adhesive layer provided therebetween or may be integrally sintered. In the electrostatic chuck 20 illustrated in FIG. 3, an electrostatic electrode 24 is arranged on a surface 22b of a dielectric layer 22 opposite a wafer placement surface 22a, and a ceramic layer 26 is arranged on the surface 22b of the dielectric layer 22 so as to cover the electrostatic electrode 24. The dielectric layer 22 and the ceramic layer 26 may be bonded together with an adhesive layer provided therebetween or may be integrally sintered. In the electrostatic chuck 30 illustrated in FIG. 4, an electrostatic electrode 34 is embedded in an oriented alumina sintered layer 31. In the oriented alumina sintered layer 31, a layer between a wafer placement surface 31a and the electrostatic electrode 34 is a dielectric layer 32, and a layer between a surface 31b opposite the wafer placement surface 31a and the electrostatic electrode 34 is a ceramic layer 36.

The present invention is not limited to the foregoing embodiments. It will be obvious that various modifications may be made within the technical scope of the present invention.

EXAMPLES

Example 1

(1) Production of Compact for Dielectric Layer

First, 0.0125 parts by mass (125 ppm by mass) of magnesium oxide (500A, available from Ube Material Industries, Ltd.), 7.8 parts by mass of poly(vinyl butyral) (item No. BM-2, available from Sekisui Chemical Co., Ltd.) serving as a binder, 3.9 parts by mass of di(2-ethylhexyl) phthalate (available from Kurogane Kasei Co., Ltd.) serving as a plasticizer, 2 parts by mass of sorbitan trioleate (Rheodol SP-O30, available from Kao Corporation) serving as a dispersant, and 2-ethylhexanol serving as a dispersion medium were added to and mixed with 100 parts by mass of a fine alumina powder (grade: TM-DAR, available from Taimei Chemicals Co., Ltd). The amount of the dispersion medium was adjusted in such a manner that the resulting slurry had a viscosity of 20,000 cP. The slurry prepared as described above was formed by a doctor blade method into a sheet having a dry thickness of 40 μm on a PET film, thereby forming a fine-alumina-powder layer.

A commercially available plate-like alumina powder (grade: YFA10030, available from Kinsei Matec Co., Ltd.) was classified with an air classifier (TC-15N, available from Nisshin Engineering Inc.) at a cut-off point of 3 μm. The classified powder was subjected to disintegration with a pot disintegrator using balls having a diameter of 0.3 mm for 20 hours. A fine powder was then removed by elutriation. To 100 parts by mass of the resulting plate-like alumina powder, 500 parts by mass of isopropyl alcohol serving as a dispersion medium was added. The resulting dispersion (plate-like alumina slurry) was dispersed with an ultrasonic disperser for 5 minutes and then sprayed on one surface of the fine-alumina-powder layer with a spray gun (Spray-Work HG Wide Airbrush, available from Tamiya, Inc.) at a spray pressure of 0.2 MPa and a spray distance of 20 cm, thereby forming a one-surface processed body. In this case, the surface coverage of the fine-alumina-powder layer with the plate-like alumina powder was 1%. The coverage of the one-surface processed body was calculated as follows: The surface of the fine-alumina-powder layer was observed with an optical microscope. An observation photograph of the surface was subjected to image processing to distinguish a plate-like alumina powder portion from the other portion. The proportion of the area of the plate-like alumina powder to the area of the surface of the fine-alumina-powder layer in the observation photograph was defined as the coverage.

The resulting one-surface processed body was cut into circles having a diameter of 300 mm and peeled from the PET film. Then 30 layers were stacked in such a manner that the processed surfaces that had been sprayed were not superposed on each other. The resulting stack was placed on an Al plate having a thickness of 10 mm and then placed in a package. The package was vacuumized to form a vacuum package. The vacuum package was subjected to isostatic pressing at a pressure of 100 kgf/cm$^2$, thereby providing a multilayer body. The multilayer body was used as a compact for a dielectric layer.

(2) Production of Ceramic Layer (2a) Production of Compact for Ceramic Layer

A multilayer body was produced as in (1), except that 350 layers of the one-surface processed bodies were stacked. The multilayer body was used as a compact for a ceramic layer.

(2b) Sintering of Compact for Ceramic Layer

The compact for a ceramic layer was placed in a degreasing furnace and degreased at 600° C. for 10 hours. The degreased body was sintered by hot pressing with a graphite die set at a sintering temperature (maximum temperature) of 1,975° C. for 4 hours at a surface pressure of 200 kgf/cm$^2$ in nitrogen, thereby forming an alumina sintered body.

(2c) Production of Ceramic Layer

The resulting alumina sintered body as described above was fixed to a ceramic surface plate and ground with a grindstone of #2,000 to flatten the surface. Subsequently, the surface was smoothed by lapping with a diamond abrasive to provide a smooth alumina sintered body having a diameter of 300 mm and a thickness of 6 mm. The smooth alumina sintered body was used as a ceramic layer. The roughness (Ra) of the surface smoothed by the lapping was 0.8 μm or less.

(3) Printing of Electrostatic Electrode

First, 60% by mass of a tungsten powder, 40% by mass of an alumina powder, and terpineol serving as a binder were mixed together to prepare a printing paste. As the alumina powder, an alumina powder (grade: TM-DAR, available from Taimei Chemicals Co., Ltd.) was used. A printed electrode having a diameter of 290 mm and a thickness of 10 μm was formed on the smooth surface of the ceramic layer by a screen printing method with the prepared printing paste, and dried.

(4) Production of Electrostatic Chuck

The compact for a dielectric layer produced in (1) was placed in a degreasing furnace and degreased at 600° C. for 10 hours to provide a degreased body for a dielectric layer. The ceramic layer on which the electrostatic electrode had been formed by printing was placed in a graphite die set. The degreased body for a dielectric layer was placed on the side of the surface of the ceramic layer on which the electrode had been formed by printing. Sintering was performed by hot pressing at a sintering temperature (maximum temperature) of 1,975° C. for 4 hours at a surface pressure of 200 kgf/cm$^2$ in nitrogen, thereby providing an integrated sintered body in which the ceramic layer, the electrostatic electrode, and the dielectric layer were integrated together.

A surface of the integrated sintered body adjacent to the dielectric layer was subjected to surface grinding with a diamond abrasive to adjust the thickness of the dielectric layer, i.e., the thickness between the embedded electrostatic electrode and the surface of the dielectric layer, to 0.1 mm. Polishing was then performed in such a manner that the wafer placement surface of the dielectric layer had a surface roughness (Ra) of 0.5 μm or less. Side surfaces of the integrated sintered body were ground. Necessary drilling, the mounting of a ceramic cylinder covering the periphery of an electrode terminal, and the connection of the electrode terminal to the electrostatic electrode were performed to complete an electrostatic chuck.

(5) Properties of Dielectric Layer

Various properties of the dielectric layer and the electrostatic chuck were measured as described below. Table 1 lists the measurement results.

TABLE 1

| | | | | | Properties of dielectric layer | | | | |
|---|---|---|---|---|---|---|---|---|---|
| | Degree of c-Plane | XRC · | Sintered | Amount of | | Volume resistivity (Ω · cm) | | | |
| Experimental example | Orientation (%) | FWHM (°) | grain size (μm) | impurity (mass ppm) | Room temperature | 100° C. | 200° C. | 300° C. | 400° C. |
| 1 | 100 | 0.9 | 66 | Mg: 62 | >1 × 10$^{17}$ | >1 × 10$^{17}$ | >1 × 10$^{17}$ | >1 × 10$^{17}$ | 9.4 × 10$^{15}$ |
| 2 | 100 | 3.7 | 55 | Mg: 157 F: 89 | >1 × 10$^{17}$ | >1 × 10$^{17}$ | >1 × 10$^{17}$ | >1 × 10$^{17}$ | 8.6 × 10$^{15}$ |
| 3 | 5.9 | Not available | 66.8 | Mg: 1214 F: 1320 | >1 × 10$^{17}$ | >1 × 10$^{17}$ | >1 × 10$^{17}$ | 6.1 × 10$^{16}$ | 5.3 × 10$^{14}$ |
| 4 | 76 | 7.1 | 91.6 | Mg: 447 F: 660 | >1 × 10$^{17}$ | >1 × 10$^{17}$ | >1 × 10$^{17}$ | 4.5 × 10$^{16}$ | 39 × 10$^{14}$ |
| 5 | 81.7 | 14.9 | 29.2 | Mg: 256 F: 0.4 | >1 × 10$^{17}$ | >1 × 10$^{17}$ | >1 × 10$^{17}$ | >1 × 10$^{17}$ | 3.4 × 10$^{15}$ |
| 6 | 95.6 | 7.1 | 16 | Mg: 151 F: 91 | >1 × 10$^{17}$ | >1 × 10$^{17}$ | >1 × 10$^{17}$ | 2.1 × 10$^{16}$ | 1.8 × 10$^{14}$ |
| 7 | 0 | Not available | 81 | Mg: 152 | >1 × 10$^{17}$ | >1 × 10$^{17}$ | >1 × 10$^{17}$ | 3.1 × 10$^{16}$ | 2.4 × 10$^{14}$ |

| | Properties of dielectric layer | | | | | Properties of electrostatic chuck | |
|---|---|---|---|---|---|---|---|
| Experimental example | Bulk density (g/cm3) | Four-point flexural strength (Mpa) | Proportion by volume of pores (vdppm) | Number of foreign objects | Ra after corrosion resistance test (nm) | Attractive force at room temperature (Pa) | Attractive force at 400° C. (Pa) |
| 1 | 3.98 | 483 | 6.4 | 26 | 20 | 3190 ± 10 | 3180 ± 20 |
| 2 | 3.98 | 438 | 0.6 | 3 | 19 | 3180 ± 10 | 3170 ± 20 |
| 3 | 3.98 | 280 | 21.8 | 25 | 38 | 2840 ± 60 | 2820 ± 70 |
| 4 | 3.98 | 152 | 11.1 | 19 | 29 | 3040 ± 30 | 3030 ± 30 |
| 5 | 3.98 | 496 | 5.8 | 7 | 27 | 3100 ± 40 | 3090 ± 50 |
| 6 | 3.98 | 552 | 18.8 | 9 | 26 | 3110 ± 20 | 3100 ± 20 |
| 7 | 3.98 | 361 | 34.2 | 21 | 65 | 2430 ± 160 | 2430 ± 190 |

(5a) Degree of c-Plane Orientation

To examine the degree of orientation of the dielectric layer, a portion of another electrostatic chuck produced in the same way as above was cut. The upper surface of the dielectric layer was irradiated with X-ray to measure the degree of c-plane orientation. An XRD profile was measured with an XRD apparatus (RINT-TTR III, available from Rigaku Corporation) in the 2θ range of 20° to 70°. Specifically, the measurement was performed using CuKα radiation at a voltage of 50 kV and a current of 300 mA. The degree of c-plane orientation was calculated by the Lotgering method. Specifically, the degree of c-plane orientation was calculated from a formula described below. In the formula, P represents a value obtained from the XRD profile of the dielectric layer, and P0 represents a value calculated form reference α-alumina (JCPDS card No. 46-1212). The degree of c-plane orientation of the dielectric layer of Experimental example 1 was 100%.

$$\text{Degree of c-plane orientation } [\%] = \frac{p - p_0}{1 - p_0} \times 100 \quad \text{[Math. 1]}$$

$$p_0 = \frac{I_0(006)}{\sum I_0(hkl)}$$

$$p = \frac{I_s(006)}{\sum I_s(hkl)}$$

(5b) Tilt Angle

Figure 6:
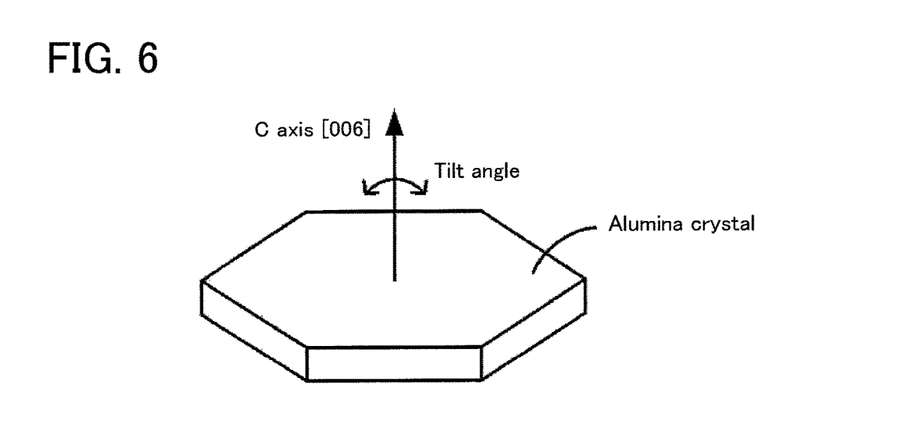
FIG. 6 is an explanatory diagram illustrating a tilt angle.

The tilt angle indicates the distribution of tilt of the crystal axis and serves as a parameter to evaluate how much the crystal orientation of alumina is tilted from the c-axis (see FIG. 6). Here, the tilt angle is represented by the full width at half maximum of an X-ray rocking curve (XRC·FWHM).

Figure 7:
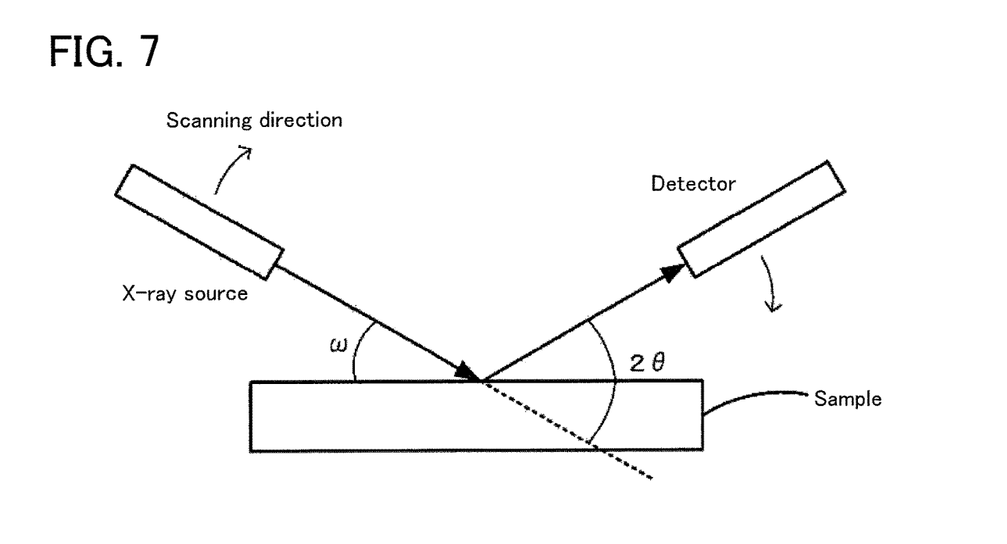
FIG. 7 is an explanatory diagram illustrating a rocking curve measurement.

The XRC·FWHM was measured by scanning the surface of the dielectric layer (the same surface subjected to the measurement of the degree of c-plane orientation) with an X-ray source and a detector in a ganged manner and measuring the full width at half maximum of the resulting curve (see FIG. 7). The measurement method as described above is what is called a rocking curve measurement in which the value of 2θ (angle between the detector and the incident X-ray) is fixed to a diffraction peak position and only ω (angle between the surface of the sample substrate and the incident X-ray) is scanned. A RINT-TTR III (available from Rigaku Corporation) was used as an instrument. The scan range of ω was 3.8° to 38.8° using CuKα radiation at a voltage of 50 kV and a current of 300 mA. The XRC·FWHM of the dielectric layer of Experimental example 1 was 0.9°.

(5c) Evaluation of Sintered Grain Size

Regarding the sintered grains of the dielectric layer, the average sintered grain size on the surface was measured by the following method: The dielectric layer cut from the electrostatic chuck was thermally etched at 1,550° C. for 45 minutes. Then an image thereof was captured with a scanning electron microscope. The range of the field of view was set in such a manner that when diagonals were drawn on the resulting image, each of the diagonals intersects with 10 to 30 grains. The average sintered grain size of the surface was determined by multiplying the average length of segments in all grains intersecting with two diagonals drawn on the image by 1.5. The average sintered grain size of the surface was 66 μm.

(5d) Amount of Impurity

A compact for a dielectric layer was produced in the same way as in (1) and degreased at 600° C. for 10 hours to form a degreased body for a dielectric layer. The resulting degreased body for a dielectric layer was subjected to hot-pressing sintering under the same conditions as in (4) to form a dielectric layer alone. The resulting dielectric layer was used as a measurement sample. The measurement sample was pulverized with an alumina mortar with a purity of 99.9% by mass and then quantitatively analyzed by methods described below. Elements other than Al or O were quantitatively analyzed by methods described below. Regarding the elements other than Al or O in the measurement sample of Experimental example 1 (dielectric layer), 62 ppm of Mg alone was detected, and no other element was detected.

C and S: Carbon and sulfur were analyzed by a firing (high-frequency heating)-infrared absorption spectroscopy with a carbon and sulfur analyzer (CS844, available from LECO Corporation). The lower detection limit is 10 ppm.

N: Nitrogen was analyzed by an inert gas fusion-thermal conductivity method with an oxygen and nitrogen analyzer (EMGA-650W, available from Horiba, Ltd). The lower detection limit is 10 ppm.

H: Hydrogen was analyzed by inert gas fusion-nondispersive infrared absorption spectroscopy with a hydrogen analyzer (EMGA-921, available from Horiba, Ltd). The lower detection limit is 10 ppm.

F: The mirror-polished alumina sintered body was subjected to dynamic secondary ion mass spectroscopy (D-SIMS). As a measurement instrument, a PHI ADEPT 1010 was used. Measurement conditions were as follows:

Primary ion species: $Cs^+$
Primary ion accelerating energy: 3 keV
Secondary ion polarity: Negative
Charge compensation: E-gun
Sputtering cycle: 100 to 500 cycles The average of values obtained from 200 to 300 sputtering cycles was used as the amount of F. In the case of the quantitative analysis, a reference sample of a known concentration, the reference sample having the same composition (AlO) as the analysis sample, was measured under the same conditions as the analysis sample to determine a relative sensitivity factor, and then the quantitative analysis was performed.

Elements other than those described above (mainly, Si, Fe, Ti, Na, Ca, Mg, K, P, V, Cr, Mn, Co, Ni, Cu, Zn, Y, Zr, Pb, Bi, Li, Be, B, Cl, Sc, Ga, Ge, As, Se, Br, Rb, Sr, Nb, Mo, Ru, Rh, Pd, Ag, Cd, In, Sn, Sb, Te, Cs, Ba, Hf, Ta, W, Ir, Pt, Au, Hg, La, Ce, Pr, Nd, Sm, Eu, Gd, Tb, Dy, Ho, Er, Tm, Yb, and Lu): The alumina powder was dissolved using a method of decomposition by sulfuric acid in a pressure vessel according to JIS R1649 and analyzed with an induction coupled plasma (ICP) emission spectrometer (PS3520UV-DD, available from Hitachi High-Technologies Corporation). The lower detection limit is 10 ppm.

Ba, Sr, and Pb were analyzed by another method described below and were not detectable.

Ba, Sr, and Pb: The alumina powder was fused with molten sodium carbonate and analyzed with an inductively coupled plasma (ICP)-mass spectrometer (iCAPQC, available from Thermo Fisher Scientific Inc).

(5e) Volume Resistivity

The volume resistivity of the measurement sample produced in (5d) was measured by a method according to JIS C2141. The measurement was performed in a vacuum atmosphere at different temperatures: room temperature (25° C.), 100° C., 200° C., 300° C., and 400° C. A test piece had a diameter of 50 mm and a thickness of 1 mm. Electrodes were formed using a silver paste in such a manner that a main electrode had a diameter of 20 mm, a guard electrode had an inside diameter of 30 mm and an outside diameter of 40 mm, and an application electrode had a diameter of 45 mm. The applied voltage was 1,000 V/mm. A current was measured, and the volume resistivity was calculated. The volume resistivity of the measurement sample (dielectric layer) of Experimental example 1 was more than $1\times10^{17}$ Ωcm at room temperature to 300° C. and $9.4\times10^{15}$ Ωcm at 400° C.

(5f) Density

The bulk density of the measurement sample produced in (5d) was measured by the Archimedes method according to JIS R1634. The measurement sample (dielectric layer) of Experimental example 1 had a bulk density of 3.98 g/cm³.

(5g) Four-Point Flexural Strength

The measurement sample produced in (5d) was mirror-polished to provide a surface roughness (Ra) of 8 nm. A bar measuring 4×0.5×20 mm was cut from the mirror-polished measurement sample. The four-point flexural strength thereof was measured. The distance between outer supported points was 15 mm. The distance between inner supported points was 5 mm. The four-point flexural strength was calculated from the formula of the four-point flexural strength described in JIS 1601:2008 using a load when the test piece was broken. The measurement sample (dielectric layer) of Experimental example 1 had a four-point flexural strength of 483 MPa.

(5h) Pore and Foreign Object

A freely-selected cross section of the measurement sample produced in (5d) was subjected to preliminary polishing with a diamond abrasive and then polished with a cross-section polisher (CP) (IB-09010CP, manufactured by JEOL, Ltd). The CP falls under the category of ion milling. The reason the CP was used is that particles are not generated on the polished surface. The resulting cross section was photographed with a scanning electron microscope (JSM-6390, available from JEOL, Ltd). Regarding the observed magnification, specifically, images of fields of view each having a length of 92.5 μm and a width of 124.0 μm were captured at a magnification of 1,000 in such a manner that four images in the longitudinal direction and three images in the width direction were arranged to form a continuous secondary electron image and a continuous backscattered electron image (370.0 μm in length×372.0 μm in width). The number of pores having a diameter of 0.2 μm or more and the number of foreign objects having a diameter of 0.2 μm or more were visually counted. In this case, the longest side of each of the observed pores was used as a diameter. In the secondary electron image and the backscattered electron image, alumina appears gray, the pores appear black, and the foreign objects appear as a different contrast from alumina and pores. Thus, alumina, the pores, and the foreign objects can be easily visually distinguished. A portion that was difficult to identify was identified with an EDS (JSM-6390, available from JEOL, Ltd). In the observed pores and foreign objects, the average of the longest sides was used as a diameter. Next, the proportion by volume of the pores having a diameter of 0.2 μm or more with respect to the volume of the alumina sintered body was calculated using a formula described below.

$$\text{Proportion by volume of pores} = \{\pi\times(R/2)^2/137640\}\times N$$

R: the diameter of the pores (μm)
N: the number of the pores

In the alumina sintered body of Experimental example 1, the proportion by volume of the observed pores having a diameter of 0.2 μm or more with respect to the volume of the alumina sintered body was 6.4 ppm by volume, and the number of the observed foreign objects having a diameter of 0.2 μm or more was 26.

(5i) Plasma Corrosion Resistance

The measurement sample produced in (5d) was mirror-polished to provide a surface roughness (Ra) of 8 nm. The mirror-polished measurement sample was subjected to a corrosion resistance test with an inductively coupled plasma (ICP) corrosion resistance testing apparatus under conditions described below, and the surface roughness (Ra) after the corrosion resistance test was measured. The surface roughness (Ra) was measured in an area of 1.4 mm×1.05 mm of a sample surface with an optical measurement instrument (NewView7300, available from Zygo Corporation). The measurement sample (dielectric layer) of Experimental example 1 after the corrosion resistance test had a surface roughness Ra of 20 nm.

ICP: 800 W, bias: 450 W, introduction gas: $NF_3/O_2/Ar=75/35/100$ sccm, 0.05 Torr, exposure time: 10 h, sample temperature: room temperature (6) Properties of Electrostatic Chuck The attractive force and the distribution of the attractive force of the electrostatic chuck were evaluated. A specific measurement method is as follows: A 5-cm-diameter probe composed of silicon (hereinafter, referred to as a "silicon probe") was brought into contact with the wafer placement surface of the electrostatic chuck in a vacuum. A DC voltage of 2,000 V was applied between the electrostatic electrode of the electrostatic chuck and the silicon probe to fix the silicon probe to the electrostatic chuck by attraction. Sixty seconds after the application of the voltage, while the voltage is applied, the silicon probe was pulled in the direction in which the silicon probe was detached from the wafer placement surface of the electrostatic chuck. A force (attractive force) required to detach the silicon probe was measured at room temperature (25° C.) and 400° C. The measurement was performed at freely-selected 20 points on the surface of the electrostatic chuck. The electrostatic chuck of Experimental example 1 had an attractive force of 3,190±10 Pa at room temperature and 3,180±20 Pa at 400° C. and exhibited a high attractive force and very low variations in attractive force.

Experimental Example 2

(1) Production of Compact for Dielectric Layer

Figure 5A:
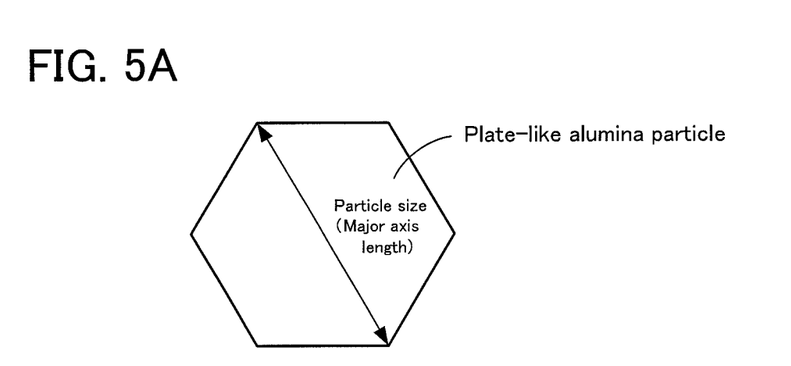
FIG. 5A is a plan view schematically illustrating a plate-like alumina particle and FIG. 5B is a front view schematically illustrating the plate-like alumina particle.
Figure 5B:
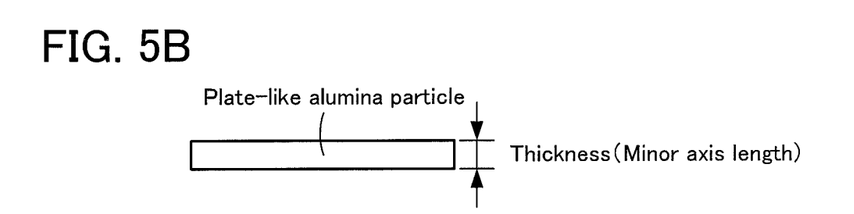

A plate-like alumina powder was prepared as follows: First, 96 parts by mass of high-purity γ-alumina (TM-300D, available from Taimei Chemicals Co., Ltd.), 4 parts by mass of high-purity $AlF_3$ (high grade, available from Kanto Chemical Co., Inc.), 0.17 parts by mass of high-purity α-alumina (TM-DAR, available from Taimei Chemicals Co., Ltd., D50=1 μm) serving as seed crystals, and isopropyl alcohol (IPA) serving as a solvent were mixed together using a pot mill with alumina balls having a diameter of 2 mm for 5 hours. After the pot mill mixing, IPA was removed with an evaporator to give a powder mixture. Next, 300 g of the resulting powder mixture was placed in a sagger (volume: 750 cm³) composed of high-purity alumina having a purity of 99.5% by mass, covered with a lid composed of high-purity alumina having a purity of 99.5% by mass, and heat-treated at 900° C. for 3 hours in an electric furnace under an air stream. The flow rate of air was 25,000 cc/min. The heat-treated powder was subjected to annealing treatment at 1,150° C. for 42.5 hours in air and then pulverized with alumina balls having a diameter of 2 mm for 4 hours to provide a plate-like alumina powder having an average particle size of 2 μm, a thickness of 0.3 μm, and an aspect ratio of about 7. The average particle size, the average thickness, and the aspect ratio of the particles were determined by observing freely-selected 100 particles in the plate-like alumina powder with a scanning electron microscope (SEM). The average particle size refers to the average length of the long axes of the plate surfaces of the particles. The average thickness refers to the average length (thickness) of the short axes of the particles. The aspect ratio refers to average particle size/average thickness. FIG. 5A is a plan view schematically illustrating a plate-like alumina particle and FIG. 5B is a front view schematically illustrating the plate-like alumina particle. The plate-like alumina particle has a substantially hexagonal shape in plan view. The particle size thereof is illustrated in FIG. 5A. The thickness thereof is illustrated in FIG. 5B.

Next, 2.0 parts by mass of the plate-like alumina powder prepared as described above was mixed with 98.0 parts by mass of a fine alumina powder (TM-DAR, average particle size: 0.1 μm, available from Taimei Chemicals Co., Ltd.) having a smaller particle size than the thickness of the plate-like alumina powder. Then 0.035 parts by mass of magnesium oxide (500A, available from Ube Material Industries, Ltd.), 7.8 parts by mass of poly(vinyl butyral) (item No. BM-2, available from Sekisui Chemical Co., Ltd.) serving as a binder, 3.9 parts by mass of di(2-ethylhexyl) phthalate (available from Kurogane Kasei Co., Ltd.) serving as a plasticizer, 2 parts by mass of sorbitan trioleate (Rheodol SP-O30, available from Kao Corporation) serving as a dispersant, and 2-ethylhexanol serving as a dispersion medium were added to and mixed with 100 parts by mass of the alumina powder mixture. The amount of the dispersion medium was adjusted in such a manner that the resulting slurry had a viscosity of 20,000 cP. The slurry prepared as described above was formed by a doctor blade method into a sheet having a dry thickness of 20 μm on a PET film. After the resulting tape was cut into circles having a diameter of 300 mm, 60 circles were stacked. The resulting stack was placed on an Al plate having a thickness of 10 mm and then placed in a package. The package was vacuumized to form a vacuum package. The vacuum package was subjected to isostatic pressing at a pressure of 100 kgf/cm², thereby providing a disk-like multilayer body. The multilayer body was used as a compact for a dielectric layer.

(2) Production of Ceramic Layer (2a) Production of Compact for Ceramic Layer

A disk-like multilayer body was produced as in (1), except that 700 circles obtained from the tape were stacked. The multilayer body was used as a compact for a ceramic layer.

(2b) Sintering of Compact for Ceramic Layer

The compact for a ceramic layer was placed in a degreasing furnace and degreased at 600° C. for 10 hours. The degreased body was sintered by hot pressing with a graphite die set at a sintering temperature (maximum temperature) of 1,975° C. for 4 hours at a surface pressure of 200 kgf/cm² in nitrogen, thereby forming an alumina sintered body.

(2c) Production of Ceramic Layer

The resulting alumina sintered body was fixed to a ceramic surface plate and ground with a grindstone of #2,000 to flatten the surface. Subsequently, the surface was smoothed by lapping with a diamond abrasive to provide a smooth alumina sintered body having a diameter of 300 mm and a thickness of 6 mm. The smooth alumina sintered body was used as a ceramic layer. The roughness (Ra) of the surface smoothed by the lapping was 0.8 μm or less.

(3) Printing of Electrostatic Electrode

First, 60% by mass of a tungsten powder, 40% by mass of an alumina powder, and terpineol serving as a binder were mixed together to prepare a printing paste. As the alumina powder, an alumina powder (grade: TM-DAR, available from Taimei Chemicals Co., Ltd.) was used. A printed electrode having a diameter of 290 mm and a thickness of 10 µm was formed on the smooth surface of the ceramic layer by a screen printing method with the prepared printing paste, and dried.

(4) Production of Electrostatic Chuck

The compact for a dielectric layer produced in (1) was placed in a degreasing furnace and degreased at 600° C. for 10 hours to provide a degreased body for a dielectric layer. The ceramic layer on which the electrostatic electrode had been formed by printing was placed in a graphite die set. The degreased body for a dielectric layer was placed on the side of its surface on which the electrode had been formed by printing. Sintering was performed by hot pressing at a sintering temperature (maximum temperature) of 1,975° C. for 4 hours at a surface pressure of 200 kgf/cm² in nitrogen, thereby providing an integrated sintered body in which the ceramic layer, the electrostatic electrode, and the dielectric layer were integrated together.

A surface of the integrated sintered body adjacent to the dielectric layer was subjected to surface grinding with a diamond abrasive to adjust the thickness of the dielectric layer, i.e., the thickness between the embedded electrostatic electrode and the surface of the dielectric layer, to 0.1 mm. Polishing was then performed in such a manner that the wafer placement surface of the dielectric layer had a surface roughness (Ra) of 0.5 µm or less. Side surfaces of the integrated sintered body were ground. Necessary drilling, the mounting of a ceramic cylinder covering the periphery of an electrode terminal, and the connection of the electrode terminal to the electrostatic electrode were performed to complete an electrostatic chuck.

(5) Properties of Dielectric Layer

Various properties of the dielectric layer and the electrostatic chuck were measured as in (5) of Experimental example 1. Table 1 lists the measurement results.

Experimental Example 3

An electrostatic chuck was produced as in Experimental example 2, except that in the production of the compact for a dielectric layer and the compact for a ceramic layer, the annealing treatment was not performed in the production of the plate-like alumina in Experimental example 2; in the tape formation in Experimental example 2, 10.0 parts by mass of the plate-like alumina powder and 90.0 parts by mass of the fine alumina powder were mixed, and the amount of magnesium oxide added was 0.25 parts by mass; and the sintering temperature in Experimental example 2 was 1,800° C. Various properties of the dielectric layer and the electrostatic chuck were measured as in (5) of Experimental example 1. Table 1 lists the results. The XRC·FWHM of the dielectric layer was not measured because no peak was observed in the rocking curve.

Experimental Example 4

An electrostatic chuck was produced as in Experimental example 2, except that in the production of the compact for a dielectric layer and the compact for a ceramic layer, the plate-like alumina powder was not added in the tape formation in Experimental example 2, the amount of magnesium oxide added was 0.1 parts by mass in the tape formation, and the sintering temperature in Experimental example 2 was 1,800° C. Various properties of the dielectric layer and the electrostatic chuck were measured as in (5) of Experimental example 1. Table 1 lists the results.

Experimental Example 5

An electrostatic chuck was produced as in Experimental example 2, except that in the production of the compact for a dielectric layer and the compact for a ceramic layer; in the tape formation in Experimental example 2, 0.1 parts by mass of the plate-like alumina powder and 99.9 parts by mass of the fine alumina powder were mixed, and the amount of magnesium oxide added was 0.05 parts by mass; and the sintering temperature in Experimental example 2 was 1,850° C. Various properties of the dielectric layer and the electrostatic chuck were measured as in (5) of Experimental example 1. Table 1 lists the results.

Experimental Example 6

An electrostatic chuck was produced as in Experimental example 2, except that in the production of the compact for a dielectric layer and the compact for a ceramic layer, after the annealing treatment at 1,150° C. for 42.5 hours in the preparation of the plate-like alumina in Experimental example 2, pulverization was performed with alumina balls having a diameter of 2 mm for 50 hours to prepare a plate-like alumina powder having an average particle size of 1 µm, a thickness of 0.3 µm, and an aspect ratio of about 3; and the sintering temperature in Experimental example 2 was 1,800° C. Various properties of the dielectric layer and the electrostatic chuck were measured as in (5) of Experimental example 1. Table 1 lists the results.

Experimental Example 7

An electrostatic chuck was produced as in Experimental example 2, except that in the production of the compact for a dielectric layer and the compact for a ceramic layer, the plate-like alumina powder was not added in the tape formation in Experimental example 2, 100 parts by mass of the fine alumina powder (TM-DAR, average particle size: 0.1 µm, available from Taimei Chemicals Co., Ltd.), and the sintering temperature in Experimental example 2 was 1,800° C. Various properties of the dielectric layer and the electrostatic chuck were measured as in (5) of Experimental example 1. Table 1 lists the results. The XRC·FWHM of the oriented alumina dielectric layer was not measured because no peak was observed in the rocking curve.

[Evaluation]

In the electrostatic chuck of Experimental example 7, the alumina sintered body included in the dielectric layer had a degree of c-plane orientation of 0%, thus causing large variations in attractive force on the wafer placement surface at room temperature and 400° C. In the electrostatic chuck of Experimental example 7, the surface roughness (Ra) after the corrosion resistance test was markedly larger than that before the corrosion resistance test, thus causing large variations in corrosion rate on the wafer placement surface. In contrast, each of the electrostatic chucks of Experimental examples 1 to 6, because the alumina sintered body included in the dielectric layer had a degree of c-plane orientation of 5% or more, the attractive force was large at both room temperature and 400° C., and the variations in attractive force on the wafer placement surface were small, compared with Experimental example 7. The surface roughness (Ra) after the corrosion resistance test was significantly smaller than that in Experimental example 7. The variations in corrosion rate on the wafer placement surface were small. It was thus found that each of the electrostatic chucks of Experimental examples 1 to 6, a higher wafer attraction force than that in Experimental example 7 was provided, and the wafer attraction force and the plasma corrosion resistance were more uniform on the wafer placement surface than those in Experimental example 7.

Experimental examples 1 to 6 correspond to examples of the present invention. Experimental example 7 corresponds to a comparative example. The present invention is not limited to the foregoing experimental examples. It will be obvious that various modifications may be made within the technical scope of the present invention.

The present application claims priority from Japanese Patent Application 2016-100720 filed on May 19, 2016, Japanese Patent Application No. 2015-193943 filed on Sep. 30, 2015, and Japanese Patent Application No. 2015-193944 filed on Sep. 30, 2015, the entire contents of which are incorporated herein by reference.

What is claimed is:

1. An electrostatic chuck comprising:
a dielectric layer including an oriented alumina sintered body having a degree of c-plane orientation of 5% or more, the degree of c-plane orientation being determined by a Lotgering method using an X-ray diffraction profile obtained by the irradiation of an X-ray in the 2θ range of 20° to 70°;
a ceramic layer integrated with a surface disposed opposite a wafer placement surface of the dielectric layer; and
an electrostatic electrode between the dielectric layer and the ceramic layer,
wherein a proportion by volume of pores having a diameter of 0.2 μm or more with respect to the volume of the oriented alumina sintered body is 130 ppm or less by volume.

2. The electrostatic chuck according to claim 1, wherein the ceramic layer contains alumina serving as a main component.

3. The electrostatic chuck according to claim 1, wherein the oriented alumina sintered body has a degree of c-plane orientation of 70% or more.

4. The electrostatic chuck according to claim 1, wherein the oriented alumina sintered body has a sintered grain size of 15 to 200 μm.

5. The electrostatic chuck according to claim 1, wherein the oriented alumina sintered body has a volume resistivity of $1\times10^{17}$ Ωcm or more at room temperature and a volume resistivity of $1\times10^{15}$ Ωcm or more at 200° C.

6. The electrostatic chuck according to claim 1, wherein a full width at half maximum obtained in an X-ray rocking curve (XRC) measurement of the oriented alumina sintered body is 15° or less.

7. The electrostatic chuck according to claim 1, wherein a content of an impurity element other than Mg, C, or F in the oriented alumina sintered body is 50 ppm or less.

8. The electrostatic chuck according to claim 1, wherein the oriented alumina sintered body has a content of F of 200 ppm or less by mass.

9. An electrostatic chuck comprising:
a dielectric layer including an oriented alumina sintered body having a degree of c-plane orientation of 5% or more, the degree of c-plane orientation being determined by a Lotgering method using an X-ray diffraction profile obtained by the irradiation of an X-ray in the 2θ range of 20° to 70°;
a ceramic layer integrated with a surface disposed opposite a wafer placement surface of the dielectric layer; and
an electrostatic electrode between the dielectric layer and the ceramic layer,
wherein when an image obtained by capturing a field of view having a length of 370.0 μm and a width of 372.0 μm with a scanning electron microscope at a magnification of 1,000 is visually observed, the number of foreign objects having a diameter of 0.2 μm or more is 50 or less.

10. The electrostatic chuck according to claim 9, wherein the ceramic layer contains alumina serving as a main component.

11. The electrostatic chuck according to claim 9, wherein the oriented alumina sintered body has a degree of c-plane orientation of 70% or more.

12. The electrostatic chuck according to claim 9, wherein the oriented alumina sintered body has a sintered grain size of 15 to 200 μm.

13. The electrostatic chuck according to claim 9, wherein the oriented alumina sintered body has a volume resistivity of $1\times10^{17}$ Ωcm or more at room temperature and a volume resistivity of $1\times10^{15}$ Ωcm or more at 200° C.

14. The electrostatic chuck according to claim 9, wherein a full width at half maximum obtained in an X-ray rocking curve (XRC) measurement of the oriented alumina sintered body is 15° or less.

15. The electrostatic chuck according to claim 9, wherein a content of an impurity element other than Mg, C, or F in the oriented alumina sintered body is 50 ppm or less.

16. The electrostatic chuck according to claim 9, wherein the oriented alumina sintered body has a content of F of 200 ppm or less by mass.

* * * * *